United States Patent [19]

Bjornard et al.

[11] Patent Number: 5,156,727
[45] Date of Patent: Oct. 20, 1992

[54] FILM THICKNESS UNIFORMITY CONTROL APPARATUS FOR IN-LINE SPUTTERING SYSTEMS

[75] Inventors: Erik J. Bjornard, Northfield; Michael J. Valiska, Lakeville; Clifford L. Taylor, Northfield, all of Minn.

[73] Assignee: Viratec Thin Films, Inc., Faribault, Minn.

[21] Appl. No.: 596,853

[22] Filed: Oct. 12, 1990

[51] Int. Cl.⁵ .............................................. C23C 14/34
[52] U.S. Cl. ........................ 204/298.11; 204/298.23; 204/298.25
[58] Field of Search ............. 204/192.12, 298.11, 204/298.18, 298.19, 298.21, 298.23, 298.25, 298.26

[56] References Cited

U.S. PATENT DOCUMENTS

| | | | |
|---|---|---|---|
| 3,661,759 | 5/1972 | Bruce et al. | 204/298.11 X |
| 4,278,528 | 7/1981 | Kuehnle et al. | 204/298.11 |
| 4,294,678 | 10/1981 | Kuehnle | 204/298.11 X |
| 4,315,960 | 2/1982 | Ohji et al. | 204/298.11 X |
| 4,562,093 | 12/1985 | Mario et al. | 204/298.11 X |
| 4,814,056 | 3/1989 | Welty | 204/298.11 |

*Primary Examiner*—Nam Nguyen
*Attorney, Agent, or Firm*—Heller, Ehrman, White & McAuliffe

[57] ABSTRACT

A mask arrangement is located between the cathode and substrate in an in-line sputtering system. The relative shape of the mask may be changed from outside the system. Thus, film thickness uniformity can be modified and controlled without interrupting the sputtering process.

20 Claims, 7 Drawing Sheets

FILM THICKNESS UNIFORMITY CONTROL APPARATUS FOR IN-LINE SPUTTERING SYSTEMS

BACKGROUND OF THE INVENTION

The present invention relates generally to apparatus for sputter deposition of optical coatings, and more particularly to continuous in-line sputtering apparatus for controlling the uniformity of the deposited layers.

Reactive sputtering is the process most often used for large area commercial coating applications. Typical applications are thermal control coatings for architectural and automobile glazings. In this process, the articles to be coated are passed through a series of in-line vacuum chambers isolated from one another by vacuum locks. Such an apparatus is referred to as an in-line system or a glass coater. Inside the vacuum chambers, a gas discharge, the sputtering discharge, is maintained. The sputtering discharge pressure is held between about 1 to 5 millitorr, by constantly admitting a mixture of an inert gas, such as argon, with a small proportion of a reactive gas, for example oxygen, for the formation of oxides. Each chamber contains one or more cathodes held at a negative potential in the range from about $-200$ to $-1000$ volts. The cathodes may be in the form of elongated rectangles, the length of which spans the width of the chambers. The cathodes are typically 0.10 to 0.30 meters wide and a meter or greater in length. The cathodes are surfaced with a metal with which the reactive gas will form the appropriate compound. This metal surface is frequently referred to as the sputtering target. The cathodes include a magnet array which concentrates the sputtering activity in a narrow region on the target called the sputtering zone. This type of cathode is known as a magnetron cathode.

Ions from the discharge are accelerated into the cathode and dislodge, or sputter off, atoms of the target metal which are deposited on the substrate passing beneath them. The metal atoms react on the substrate with the reactive gas in the discharge to form a thin film of the desired coating material.

The cathodes of an in-line sputtering machine are usually very long compared with their width. It is generally assumed that a substrate, passed beneath the cathode so that it's surface plane is parallel to the sputtering surface of the cathode, will receive a film of equal thickness across its entire width. It is understood that to ensure a uniformly thick film, care must be taken to make sure that the magnetron's magnetic field is constant along the surface of the cathode. It is also understood that some loss of uniformity is inevitable at the extreme ends of the cathode where the magnet array is terminated. This loss of uniformity is referred to as the "end effect". It is generally accepted that articles requiring a more or less uniform film should not be wider than the cathode length minus twice the "end effect" length. In practice, uniformity in general may be affected by other factors, such as the gas flow distribution and the sputtering gas discharge potential around the cathode.

Several different approaches to controlling coating uniformity have been taken. These include specially designed gas distribution systems surrounding the sputtering cathodes. On planar magnetron sputtering cathodes, fixed masks or shields have been used at the edge of the cathode's sputtering zone to shape the flux of sputtered material from the cathode. The problem common to these approaches is that they are static, that is, adjustments are only possible by stopping the process and opening the machine to make the adjustment.

Although it is generally believed that sputtering conditions in an in-line coater may be held stable over several days of operation, changes, particularly in the gas flow and the discharge potential, in fact, occur as the machine is operated. Coatings such as low emissivity (low-E) coatings may tolerate film thickness variations of about plus or minus five percent. Changes in the sputtering conditions necessary to create a plus or minus five percent change in film thickness may not be detectable during a normal operating period of, for example, one or two days.

High precision optical coatings, such as multilayer antireflection coatings, will not tolerate layer thickness variations much greater than plus or minus one percent. The variations are detectable as changes in the reflection color of the coated substrate. Changes in sputtering conditions producing one percent variations in coating thickness may be detectable in the first one or two hours of machine operation. The cost effectiveness of in-line coating systems is based on the ability to operate a process uninterrupted for periods of several days. It is not cost effective if a machine has to be opened every two hours to adjust a static mask or gas flow nozzles to restore film thickness uniformity.

Accordingly, it is an object of the present invention to provide a system whereby coating uniformity may be adjusted during the deposition process.

It is a further object of the present invention to provide a system whereby coating thickness profiles may be varied to accommodate different substrate configurations.

SUMMARY OF THE INVENTION

The present invention is directed to an apparatus for use in an in-line sputtering system. It comprises two plates each having front and back edges, and first and second ends. The plates are pivotally joinable at their first ends such that the front edges of the plates may be moved relative to each other. The plates may be pivoted to change the relative position of their front edges.

In an in-line sputtering machine, a substrate is coated by transporting it past a sputtering cathode or cathodes. The present invention provides a system of movable plates situated at a level between the cathode and the substrate. The plates are positioned such that they prevent a portion of the material sputtered from the cathode from reaching the substrate. The position of the plates may be adjusted from outside the coating machine so the portion of the sputtered material prevented from reaching the cathode varies along the length of the cathode. Coating uniformity may thus be varied without interrupting the coating process.

DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below serve to explain the principles of the invention.

FIG. 7 is a schematic lateral cross section showing an alternate arrangement for pivoting the plates.

DETAILED DESCRIPTION OF THE INVENTION

Figure 1:
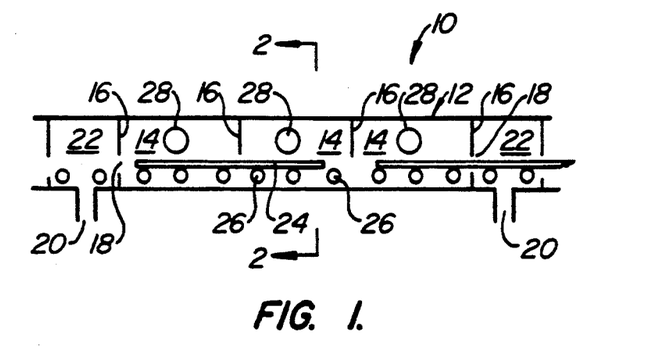
FIG. 1 is a schematic longitudinal cross section through an in-line sputtering machine.
Figure 2:
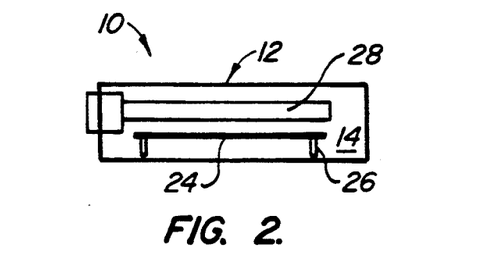
FIG. 2 is a schematic lateral cross section through an in-line sputtering machine.

Referring now to the drawings, in which like parts have like reference numerals, FIGS. 1 and 2 show the general arrangement of a section or portion of an inline sputtering machine 10. The section includes a coating chamber 12 divided into sub-chambers 14 by bulkheads 16. The sub-chambers prevent interactions between adjacent cathodes 28. The chamber 12 is evacuated through tunnels 18 and orifices 20 in dynamic vacuum locks 22. The locks 22 isolate chamber 12 from either other coating chambers, or input and output chambers (not shown). Bulkheads 16 also separate subchambers 14 from locks 22. The machine may have five coating chambers each containing three cathodes. Substrates 24 are coated by transporting them on rollers 26 past cathodes 28. The cathodes 28 may be rotating cylindrical magnetrons, as shown, or may be planar magnetrons.

Figure 3:
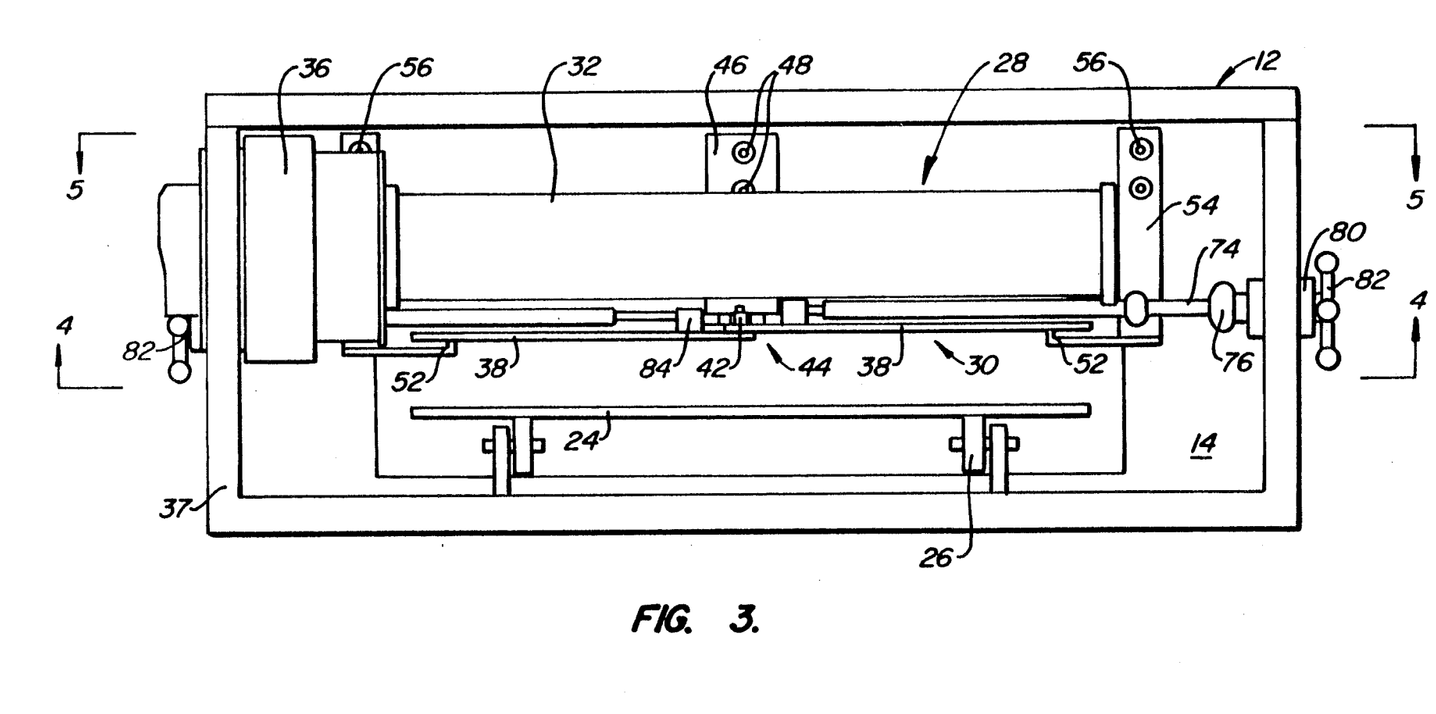
FIG. 3 is a schematic lateral cross section of a preferred embodiment of an in-line sputtering machine in accordance with the present invention, illustrating the position of the movable plates in relation to a cylindrical magnetron and substrate.
Figure 4:
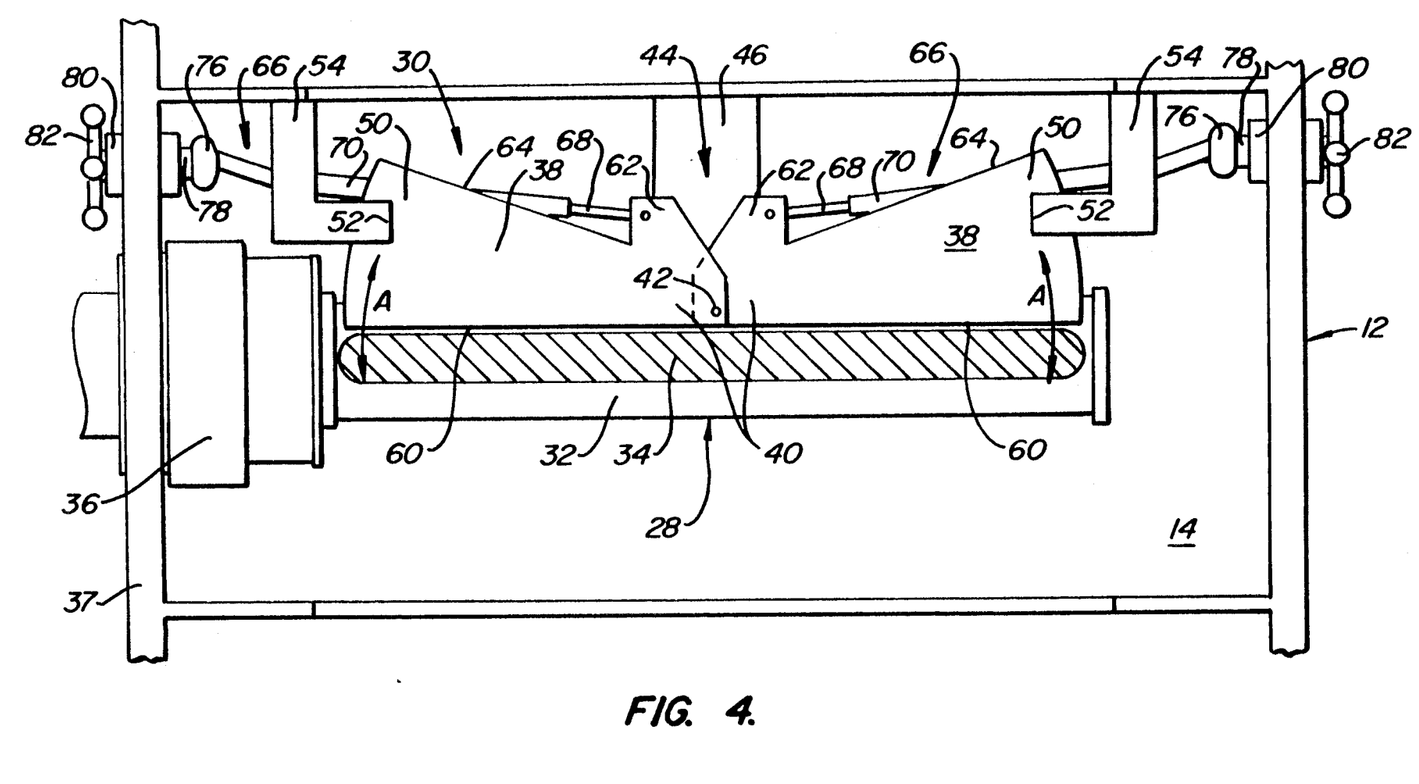
FIG. 4 is a schematic view along line 4—4 of FIG. 3, illustrating the position of the movable plates in relation to the sputtering zone of the cylindrical magnetron and the substrate.
Figure 5:
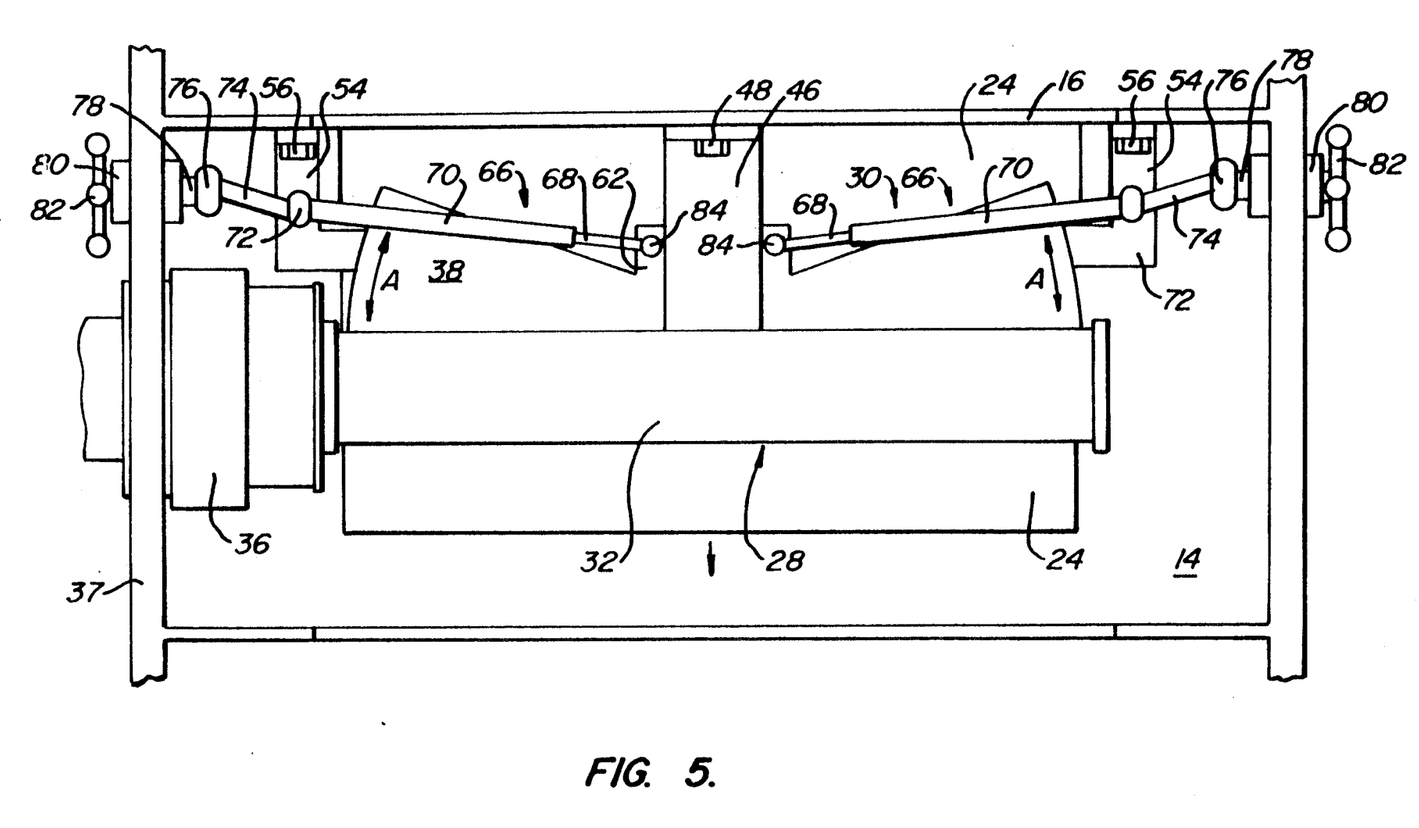
FIG. 5 is a schematic view along line 5—5 of FIG. 3, illustrating an arrangement for pivoting the movable plates.

As shown in FIGS. 3–5, cylindrical magnetron cathode 28 includes a cathode tube 32 coated with the material to be sputtered, i.e., the target material. A sputtering zone 34, illustrated by the slanted lines on tube 32 (see FIG. 4), is defined on the tube by an internal magnet array (not shown). The magnet array is held stationary while tube 32 rotates; thus, sputtering zone 34 remains in the position shown. As noted, the cathode is mounted in a sub-chamber 14 of chamber 12. The cathode is mounted by a cantilever mount, represented generally by the numeral 36, through an aperture in side chamber wall 37.

The uniformity control apparatus, represented generally by reference numeral 30, includes two plates 38 connected at their ends respective 40 by a pivot 42 to form a shield or mask 44. As shown most clearly in FIG. 4, the plates overlap at ends 40. The substrate 24 travels under cathode 30 and thus mask 44 to receive the sputtered target material. The plates 38 are mounted in sub-chamber 14 by attaching pivot 42 to a bracket 46. The bracket 46, in turn, may be mounted on a bulkhead 16 by bolts 48. Details of the pivot and mount are shown in FIG. 6.

Figure 6:
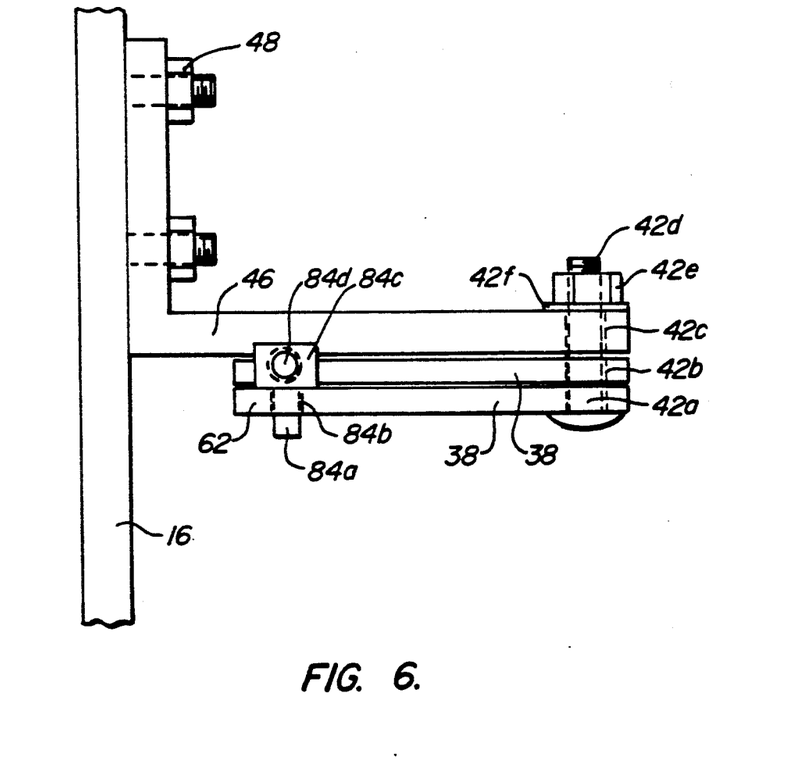
FIG. 6 is a schematic cross section showing an arrangement for providing pivots for the plates.

Specifically, as shown in FIG. 6, a pin 42a is attached to the lower one of plates 38. The pin is passed through a hole 42b in the upper of plates 38 and through a hole 42c in bracket 46. Pin 42a has a threaded end 42d and is attached to bracket 46 by a nut 42e and washer 42f.

The plates are supported at opposite ends 50, i.e., opposite from ends 40, by end supports 52 attached to brackets 54 (see FIGS. 4 and 5). The brackets 54 may be mounted by bolts 56 to bulkhead 16. The ends 50 of the plates 38 simply rest on supports 52 and are not attached thereto. Plates 38 are thus free to slide on supports 52.

The front edges 60 of plates 38 may be located along the edge of sputtering zone 34. As such, a portion of the material sputtered from the sputtering zone 34, for example up to about 30%, is intercepted by mask 44 and prevented from reaching substrate 24. The plates are pivoted by means of bell-cranks 62 extending from the rear edges 64 of plates 38. The bell-cranks may be extensions of the plate. Each bell-crank is moved by an extendable arm 66. The arm 66 comprises a threaded shaft 68, one end of which is screwed into one end of a second shaft 70. The other end of threaded shaft 68 is connected to a floating pivot 84 in bell-crank 62. The threaded shaft 68 is not free to rotate in floating pivot 84. As shown in FIG. 6, the floating pivot 84 has a pin 84a extending through a hole 84b in bellcrank 62. A boss 84c attached to pin 84a has a threaded hole 84d in which the end of shaft 68 may be securely attached.

The extendable arm 66 extends between bell-crank 62 and universal joint 72. The universal joint 72 is a component of the mechanism used to transmit rotary motion from outside the vacuum chamber to arm 66 for lengthening or shortening the arm.

The mechanism for transferring rotary motion to arm 66 includes shafts 74 and 78, and hand-wheel 82. The shaft 74 is rotatably connected to shaft 70 by a universal joint 72. The shaft 74 is also rotatably connected by a second universal joint 76 to shaft 78. Shaft 78 is sealed to chamber wall 37 by a vacuum seal 80, such as a ferrofluidic seal. Rotary motion may be applied by a hand-wheel 82 (located outside of chamber 14) to cause extendable arm 66 to be extended or shortened, depending on the direction of rotation. The extension or shortening of arm 66 moves bell-crank 62. The motion of bell-cranks 62 causes plates 38 to pivot on pivots 42 in the direction shown by arrows A.

Pivoting plates 38 in the direction shown by Arrow A alters the angle between the edges 60 of plates 38. The edges 60 may be aligned, or they may be pivoted to form an included angle between them of between about 160° and 180° (aligned). Thus, proportionately more or less material may be intercepted from the middle towards the ends of cathode tube 32.

An in-line coating machine may produce coated substrates at a rate of about one every two minutes or less. Using an instrument such as the "ULTRASCAN" (Model No. FN-7673) colorimeter available from Hunter Associates Laboratories Inc., Reston, Va., the spectral performance of the coating may be determined at a number of points on the substrate. As such, the thickness distribution of the coating maybe determined. The spectral performance data at any point may be quickly analyzed using coating optimization software, for example, the "CAMS 20" software from Optikos Inc., Cambridge, Mass. This software may be used to determine the thickness of the layers which will produce the measured spectral performance. For example, a four layer antireflection coating may be analyzed in about 15 minutes. It can thus be quickly determined which one or more of the layers in a particular system is responsible for the performance variation across the substrate.

The mask 44 may be adjusted to change the uniformity of the coating. The results of a mask adjustment to correct an error will be available, at most, in the time it takes a substrate to traverse the entire length of the in-line machine. In a machine having five chambers, this will be no longer than about 10 minutes. The result may be available in as short a time as 2 minutes, if a mask near the output end of the machine is adjusted.

The operation of bell-cranks 62 has been described as being effected by an extendable arm 66 activated by rotation. As illustrated in FIG. 7, an axial motion may also be used to operate the bell-cranks. The apparatus is similar in most regards to the preferred embodiment shown in FIGS. 3–5. Non-extendable shaft 67 connects pivot 84 on bell-crank 62 to universal joint 72. The shaft 74 is connected between universal joints 72 and 76. The operating shaft 79 may be moved axially in vacuum seal 80, i.e., in the direction shown by Arrow B. The axial motion is transmitted by shaft 74 and universal joints 72 and 76 to cause shaft 67 to move longitudinally along its axis, i.e., in the direction shown by Arrow C. As such, plates 38 pivot about point 42 in the direction of Arrow A. The mask arrangement 44, as described above, has two movable plates 38. Simple modifications of the coating thickness distribution are possible by altering the shape of the mask. For example, if front edges 60 of plates 38 were aligned, a mask 44 would have a straight edge. If front edges 60 of plates 38 were at some angle to each other, mask 44 would have a "V-shaped" edge. In an in-line coating machine, more than one cathode is usually employed to deposit a single layer. This may be done, for example, to increase the deposition rate of the layer. If, for example, three cathodes are used to deposit a layer, then up to six movable masks (one on each side of each sputtering zone, i.e., two per cathode) may be used to influence the thickness distribution of the layer. Of course, only one mask for each sputtering zone may be used.

Figure 8A:
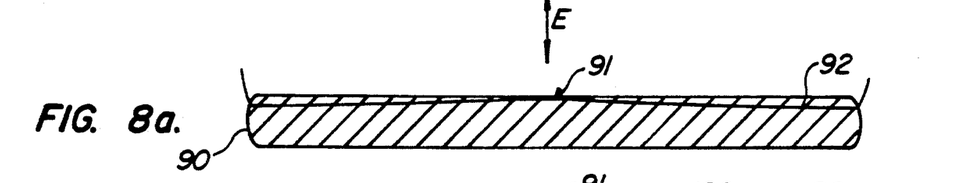
FIGS. 8(a)–(d) schematically illustrate an embodiment of the present invention for producing a complex coating thickness distribution profile.
Figure 8B:
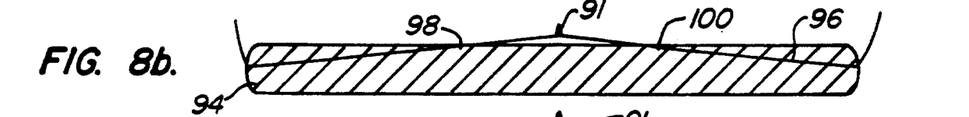
Figure 8C:
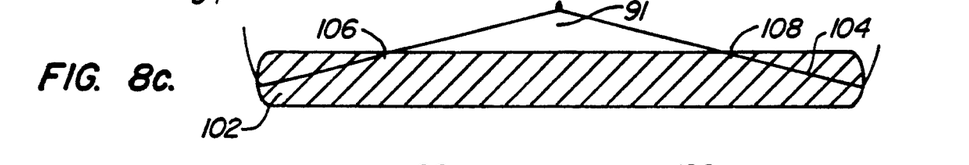
Figure 8D:
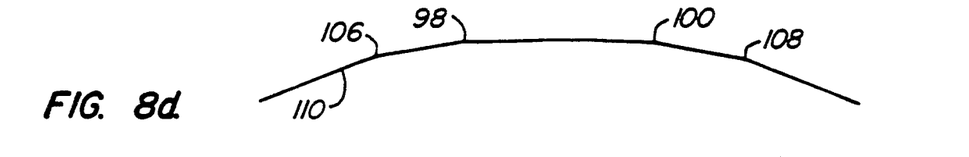

FIGS. 8(a)–8(d) show an example of how three simple "V-shaped" masks (only one mask per cathode) may be used with three cathodes to produce a layer having a complex thickness distribution. For simplicity, only the front edge of the mask forming plates is shown, and only the sputtering zone (represented by the slanted line pattern) of the cathode is shown. FIG. 8(a) shows a sputtering zone 90 of a first cathode. The mask edge 92 is in the form of a very shallow "V" with the pivot point 91 at the apex. The mask edge 92 intercepts some material at all points in the length of the sputtering zone 90. FIG. 8(b) shows a sputtering zone 94. The mask edge 96 intercepts material only from the points 98 and 100 towards the respective ends of the sputtering zone. FIG. 8(c) shows a sputtering zone 102. The mask edge 104 intercepts material only from points 106 and 108 towards the respective ends of the sputtering zone of the cathode. FIG. 8(d) shows how the three mask edges 92, 96, and 104 combine to impress a distribution profile 110 on a film deposited from sputtering zones 90, 94, and 102. The points 98, 100, 106, and 108 on profile 110 correspond to the points FIGS. 8(b) and 8(c) at which the sputtering zones 94 and 102 are intercepted by mask edges 96 and 104, respectively.

The flexibility of the above-described technique of using masks to provide complex thickness distribution profiles may be further improved by providing a mechanism to move any or all of the masks in the direction of Arrow E (FIG. 8(a)), i.e., in a direction across the sputtering zone, lengthwise of the substrate. This may be done without opening the machine by using a rack and pinion drive to change the position of mounting bracket 46. The bracket would then have to be movably attached to the bulkhead. The advantage of the added movement in the direction of Arrow E would be that the points at which the mask intercepts the sputtering zone may be changed without changing the angle between the plates. An in-line machine could thus be rapidly reconfigured to accommodate different types of substrates requiring different thickness distribution. The reconfiguration could be accomplished without venting and opening the machine.

Figure 9:
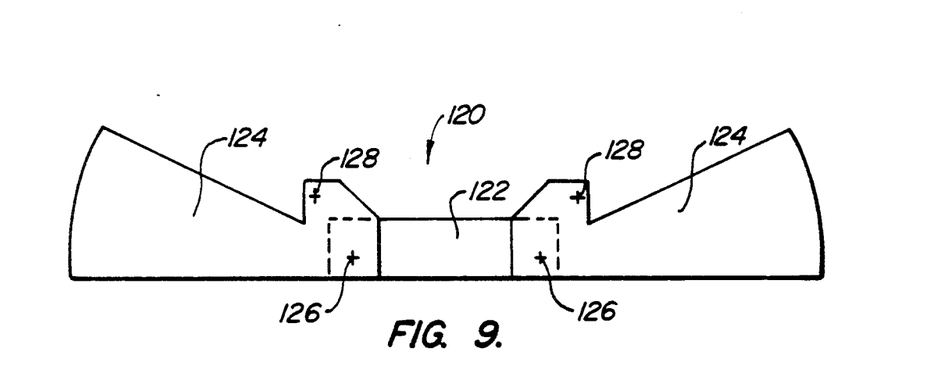
FIG. 9 schematically illustrates an embodiment of the present invention including one fixed and two movable plates.

The adjustable coating masks may use more than two plates. This arrangement provides another technique for producing a layer having a complex thickness distribution. FIG. 9 shows an example of a three plate configuration. The mask 120 comprises a fixed center plate 122 and two movable end plates 124. The plates 124 are attached to plate 122 by pivots 126. The pivots 126 may be similar in construction to pivot 42 discussed above. The movable end plates may be activated as in the above-described embodiment by extendable arms attached at points 128 on the bellcranks. The embodiment of FIG. 9 requires the same number of external mechanical linkages as the embodiment of FIGS. 3–5.

Figure 10:
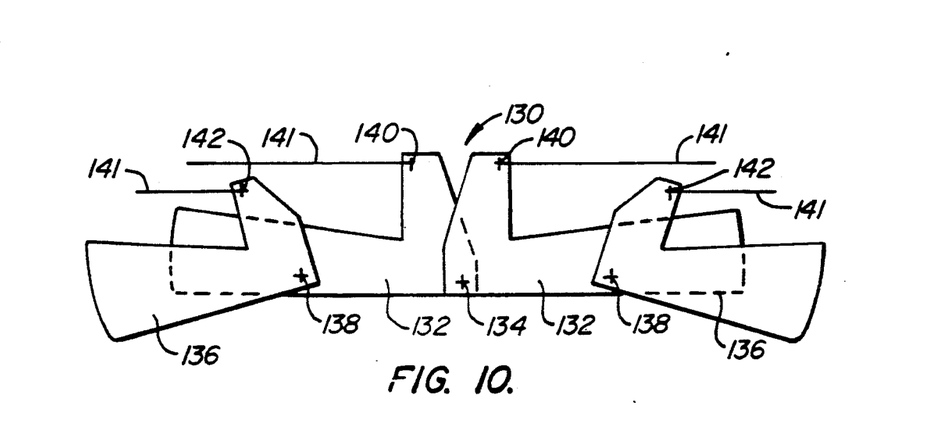
FIG. 10 schematically illustrates an embodiment of the present invention including four movable plates.

FIG. 10 illustrates a mask 130 having four movable plates. The center plates 132 are joined by a pivot 134. The outer plates 136 are attached to the outer ends of center plates 132 by pivots 138. The movable plates 132 and 136 may be activated by arms 141 attached to pivots 140 and 142.

With the mask arrangement of FIG. 9, plates 124 may be pivoted relative to fixed plate 122 to produce a distribution profile in which there is a relatively rapid fall-off in film thickness near the ends of the sputtering zone. The arrangement of FIG. 10 may be used to produce with a single mask the complex distribution profile of FIG. 8(d).

Figure 11:
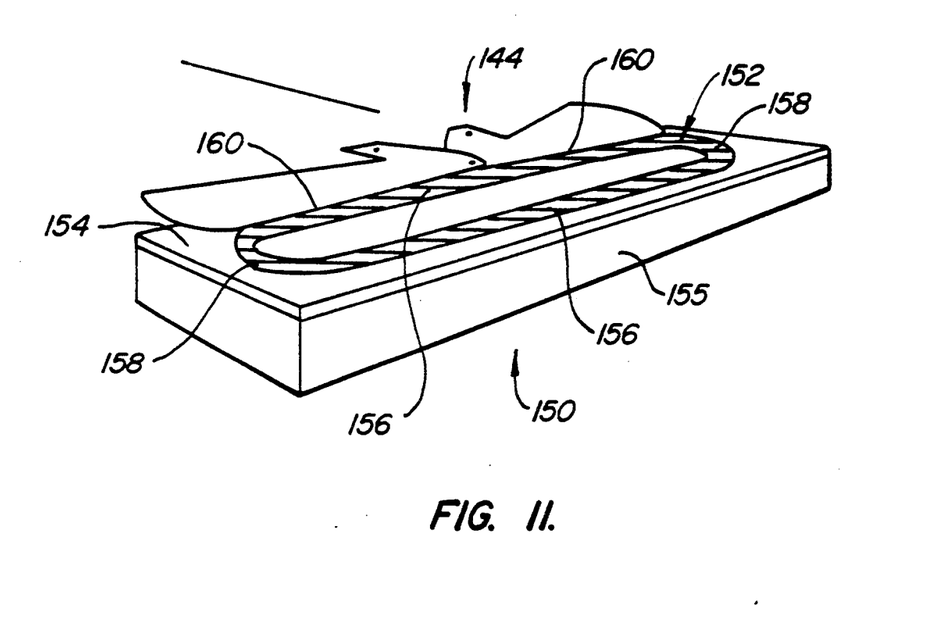
FIG. 11 schematically illustrates a mask used with a planar magnetron.

Although the present invention has been described with reference to the use of rotating cylindrical magnetrons, it may also be used with planar magnetrons. As illustrated in FIG. 11, a planar magnetron 150 has a sputtering zone 152 on a target 154. The target is attached to a cathode body 155. The sputtering zone 152 may have two long straight sections 156 and rounded ends 158. The sputtering zone 152 is usually referred to as a "racetrack". Any of the above-described mask configurations may be used with planar magnetron 150 by locating front edges 160 of mask 144 along one or both of the straight sections 156.

The externally-adjustable masks provide a useful technique for maintaining coating uniformity over long periods of machine operation. The masks may also be used to deposit films with a thickness distribution other than a uniform one. This may be required, for example, to accommodate curvatures in substrates. Any of the above-described mask techniques may be used, alone or in combination, to achieve this result.

The present invention has been described in terms a preferred embodiment and a number of other embodiments. The invention, however, is not limited to the embodiments depicted and described. Rather, the scope of the invention is defined by the appended claims.

What is claimed is:

1. Apparatus for use in an in-line sputtering system, comprising: at least two plates each having front and back edges, positioned between a target and a substrate for receiving sputtered material and first and second ends; said plates being pivotally joinable at said first ends such that said front edges of said plates may be moved relative to each other; and means for pivoting said plates to move said front edges relative to each other to adjust the shape of said mask. While said mask is positioned between said target and said substrate so that a portion of said sputtered material is prevented from reaching said substrate.

2. The apparatus of claim 1 wherein said pivoting means includes a bell-crank at said first end and at said back edge of each of said plates.

3. The apparatus of claim 2 wherein said pivoting means further includes an extendable arm pivotally attachable at one end thereof to said bell-crank and at a second end thereof to a means for rotating said extendable arm to change the length thereof.

4. The apparatus of claim 3 wherein said rotating means includes a shaft for extending through a wall of a vacuum coating chamber; a vacuum seal for rotatably sealing said shaft to the wall of the coating chamber; and means for attaching said shaft to said extendable arm to couple rotary motion thereto.

5. The apparatus of claim 2 wherein said pivoting means includes a first shaft pivotally attachable to said bell-crank, and means for moving said first shaft along its longitudinal axis.

6. The apparatus of claim 5 wherein said first shaft moving means includes a second shaft extendable through a wall of a vacuum coating chamber; a vacuum seal for sealing said second shaft to the wall of the coating chamber; and means for attaching said first shaft to said second shaft to permit movement of said first shaft along its longitudinal axis.

7. Apparatus for depositing a coating on a substrate, comprising: an in-line coating machine including at least one vacuum coating chamber, at least one sputtering cathode mounted in said chamber, and means for transporting the substrate past said cathode for receiving sputtered material; at least one mask including at least two movable plates, said mask mounted in said chamber at a position between said sputtering cathode and said substrate so that a portion of said sputtered material may be prevented from reaching said substrate depending upon the relative position of said plates; and means for moving said plates to change the relative position thereof.

8. The apparatus of claim 7 wherein said plates each have front and back edges, and first and second ends; said plates being pivotally joined at said first ends such that said front edges of said plates may be moved relative to each other.

9. The apparatus of claim 8 wherein said moving means includes a bell-crank at said first end and at said back edge of each of said plates.

10. The apparatus of claim 9 wherein said moving means further includes an extendable arm having a first shaft with a threaded end and a second shaft rotatably attached to said first shaft with a mating thread, said first shaft being pivotally attached at one end thereof to said bell-crank, and said second shaft rotatably attached to a means for rotating said extendable arm to adjust the length thereof.

11. The apparatus of claim 10 wherein said rotating means includes a third shaft extending through a wall of the coating chamber; a vacuum seal for rotatably sealing said third shaft to the wall of the coating chamber; and means for rotatably attaching said third shaft to said second shaft.

12. The apparatus of claim 7 wherein said plates are movably supported at said second ends.

13. The apparatus of claim 7 wherein said mask further includes a fixed plate to which said two movable plates are attached.

14. The apparatus of claim 7, wherein said mask includes 4 movable plates.

15. Apparatus for depositing a coating on a substrate by sputtering, comprising: an in-line coating machine including at least one vacuum coating chamber, at least one sputtering cathode mounted in said chamber, and means for transporting the substrate past said sputtering cathode for receiving sputtered material; at least one mask including at least two plates mounted at a position between said cathode and said substrate, each of said plates having front and back edges, and first and second ends, and said plates being pivotally joined at said first ends so that said front edges of said plates may be moved relative to each other; means for mounting said plates in said chamber; and means for pivoting said plates relative to each other.

16. The apparatus of claim 15 wherein said mounting means includes a center pivot bracket supporting said plates at said first ends, and two end supports movably supporting said plates at said second ends.

17. The apparatus of claim 16 wherein said pivoting means includes a bell-crank at said first end and at said back edge of each of said plates.

18. The apparatus of claim 17 wherein said pivoting means further includes an extendable arm pivotally attached at one end thereof to said bell-crank and at a second end thereof to a means for rotating said extendable arm to adjust the length thereof.

19. The apparatus of claim 18 wherein said rotary means includes a shaft extending through a wall of a coating chamber; a vacuum seal for rotatably sealing said shaft to the wall of the coating chamber; and means for attaching said shaft to said extendable arm to couple rotary motion thereto.

20. The apparatus of claim 19 wherein said attaching means includes universal joints.

* * * * *

UNITED STATES PATENT AND TRADEMARK OFFICE
CERTIFICATE OF CORRECTION

PATENT NO. : 5,156,727
DATED : October 20, 1992
INVENTOR(S) : Erik J. Bjornard, et al It is certified that error appears in the above-indentified patent and that said Letters Patent is hereby corrected as shown below:

Claim 1, Column 7, line 5, after "comprising:" insert --a mask including--; line 8, delete 'being"; and in line 12 delete "mask. While" and insert --mask while--.

Signed and Sealed this

Twenty-third Day of November, 1993

Attest:

BRUCE LEHMAN

Attesting Officer

Commissioner of Patents and Trademarks